United States Patent
Chhabra

(10) Patent No.: US 12,165,737 B2
(45) Date of Patent: Dec. 10, 2024

(54) MULTI-BITCELL STRUCTURE WITH SHARED READ PORT

(71) Applicant: Arm Limited, Cambridge (GB)

(72) Inventor: Amit Chhabra, Noida (IN)

(73) Assignee: Arm Limited, Cambridge (GB)

(*) Notice: Subject to any disclaimer, the term of this patent is extended or adjusted under 35 U.S.C. 154(b) by 304 days.

(21) Appl. No.: 17/684,894

(22) Filed: Mar. 2, 2022

(65) Prior Publication Data

US 2023/0282253 A1 Sep. 7, 2023

(51) Int. Cl.
*G11C 7/10* (2006.01)
*H03K 19/0185* (2006.01)

(52) U.S. Cl.
CPC .......... *G11C 7/1096* (2013.01); *G11C 7/1069* (2013.01); *G11C 7/1075* (2013.01); *H03K 19/018507* (2013.01)

(58) Field of Classification Search
CPC ... G11C 7/1096; G11C 7/1069; G11C 7/1075; G11C 8/16; H03K 19/018507; H10B 10/12
See application file for complete search history.

(56) References Cited

U.S. PATENT DOCUMENTS

| | | | | |
|---|---|---|---|---|
| 8,072,833 | B2* | 12/2011 | Kushida | G11C 11/419 |
| | | | | 365/154 |
| 2022/0108992 | A1* | 4/2022 | Yamagami | H01L 29/775 |
| 2023/0317717 | A1* | 10/2023 | Chhabra | H01L 27/0688 |
| | | | | 257/369 |

\* cited by examiner

*Primary Examiner* — Allison Bernstein
(74) *Attorney, Agent, or Firm* — Pramudji Law Group PLLC; Ari Pramudji

(57) ABSTRACT

Various implementations described herein are directed to a device having a multi-bitcell structure with multiple bitcells. The multiple bitcells may include first port transistors and second port transistors. The first port transistors may be arranged in a P-over-N stack configuration, and the second port transistors may be arranged in an N-over-N stack configuration.

20 Claims, 10 Drawing Sheets

200A

P-over-N Multi-Device Stack Common-Gate Architecture 204A

200B

P-over-N Multi-Device Stack Split-Gate Architecture 204B

200C

N-over-P Multi-Device Stack Common-Gate Architecture 204C

200D

N-over-P Multi-Device Stack Split-Gate Architecture 204BD

200E

N-over-N Multi-Device Stack Common-Gate Architecture 204E

200F

N-over-N Multi-Device Stack Split-Gate Architecture 204F

200G

P-over-P Multi-Device Stack Common-Gate Architecture 204G

200H

P-over-P Multi-Device Stack Split-Gate Architecture 204H

MULTI-BITCELL STRUCTURE WITH SHARED READ PORT

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some modern circuit architecture, conventional transistor based devices use traditional layout techniques and thus suffer from low density design application that may typically cause unintended consequences in fabrication processes. Therefore, traditional layout techniques can be inefficient, density deficient and typically fail to provide sufficient means for implementing various different layout configurations. Thus, there exists a need to improve traditional layout techniques that allow for efficient device fabrication.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Figure 1:
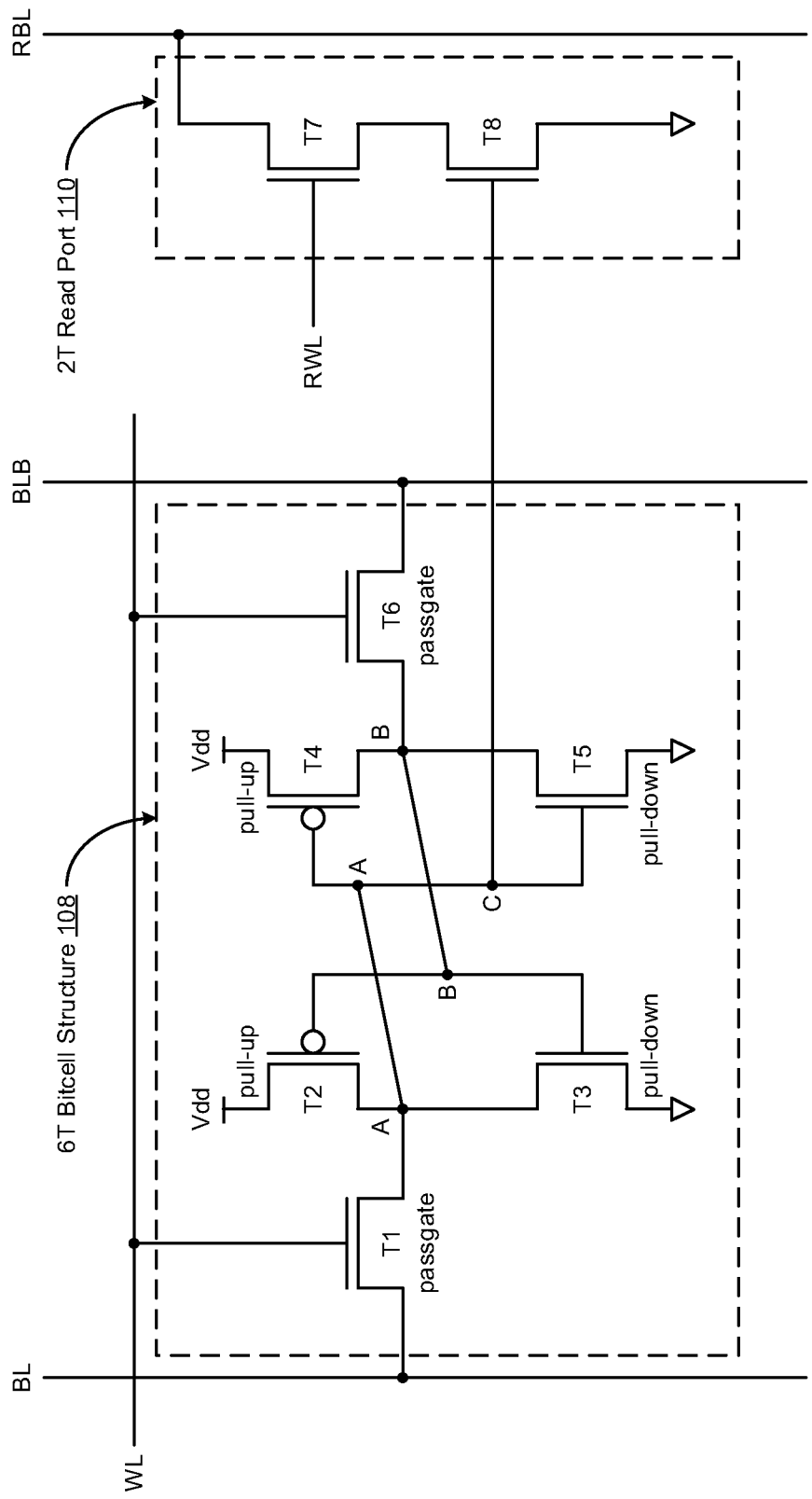
FIG. 1 illustrates a diagram of bitcell architecture in accordance with various implementations described herein.

Various implementations described herein are directed to fabrication schemes and techniques for multi-transistor dual-port bitcell architecture in various physical layout designs for multi-device stack applications. In some implementations, the multi-transistor dual-port bitcell architecture may refer to eight-transistor (8T) two-port register file bitcell structures manufactured in complimentary field-effect-transistor (FET) technology. Also, various physical layout schemes and techniques described herein may provide for multi-transistor bitcells (e.g., 6T bitcells) with shared multi-transistor read port architecture (e.g., 2T read port). In some implementations, a shared 2T read port may refer to an N-over-N stacked device that is manufactured on a single monolithic wafer or in a sequential manner.

Various implementations described herein are directed to fabrication schemes and techniques for multi-transistor stack architectures in various physical layout designs for multi-device applications. For instance, various fabrication schemes and techniques described herein provide for various hybrid device stacking techniques for complimentary field effect transistor (FET) technologies, and therefore, aspects of the present disclosure are associated with a novel device stack architecture arrangement for complimentary FET (CFET) technologies and related applications. Also, the various fabrication schemes and techniques described herein provide a method of manufacture using hybrid technologies where multiple device stacks are fabricated together in a single monolithic semiconductor die or in a sequential manner. For instance, in some applications, N-over-P stacked devices and P-over-N stacked devices may be co-manufactured on a single wafer, and also, N-over-N stacked devices and P-over-P stacked devices refer to variants that may be simultaneously manufactured along with N-over-P stacked devices and/or P-over-N stacked devices in the same, single monolithic semiconductor die or wafer. In other applications, N-over-P stacked devices and P-over-N stacked devices may be formed, fabricated or manufactured in a sequential manner.

In some implementations, multi-transistor fabrication schemes and techniques described herein use novel technology that supports complimentary FET (CFET) devices, wherein each device is fabricated with nano-sheets (NS) or Fin-FET(FF) that are used to form multiple devices in multi-transistor stacks within a single monolithic semiconductor die with multiple devices stacked on top of each other. In other applications, the multi-transistor stacks may be formed, fabricated or manufactured in a sequential manner. The various fabrication schemes and techniques described herein provide for multiple complimentary stack configurations, such as, e.g., an NN based structure having an N-over-N stack configuration and a PP based structure having a P-over-P stack configuration. In various instances, the gates for PFET devices and NFET devices may utilize common-gate and/or split-gate architecture in the multi-device stack configurations. Further, the multi-transistor fabrication schemes and techniques described herein also utilize technology that supports N-over-P devices along with P-over-N devices as additional stack configurations that may be fabricated with the N-over-N and P-over-P stack configurations within a single monolithic semiconductor die in various multi-transistor stack applications. In other applications, the multi-transistor stacks may be formed, fabricated or manufactured in a sequential manner.

In various implementations, there are multiple different ways of building device architecture for stacked transistors. For instance, one way is to build stacked transistors in a monolithic fashion, which refers to using a single wafer with 2 or 4 sets of nanosheets for processing the wafer. In another instance, another way is to build stacked transistors in a sequential fashion, wherein one device stack is processed first, followed by another layer of device stack using a substantially thinned wafer. These multiple methods provide flexibility in managing various different devices in the stack in terms of threshold voltage, gate connections, etc. Therefore, stacked devices may be manufactured using various fabrication schemes and techniques described herein, including monolithic (monolithically formed stacks) and sequential (sequentially formed stacks).

Various implementations of providing multi-transistor fabrication schemes and techniques will be described herein with FIGS. 1, 2A-2H, 3A-3C and 4A-4B.

FIG. 1 illustrates a diagram 100 of bitcell architecture 104 in accordance with various implementations described herein. In some scenarios, the bitcell architecture 104 may refer to an 8-transistor (8T) dual-port bitcell architecture having a six-transistor (6T) bitcell structure with a two-transistor (2T) read port structure 110.

In some implementations, the bitcell architecture 104 may be implemented as a system or a device having various integrated circuit (IC) components that are arranged and coupled together as an assemblage or combination of parts that provide for physical circuit designs and various related structures. In some instances, a method of designing, providing and building the bitcell architecture 104 as an integrated system or device may involve use of various IC circuit components described herein so as to thereby implement fabrication schemes and techniques associated therewith. Also, the bitcell architecture 104 may be integrated with computing circuitry and related components on a single chip, and the bitcell architecture 104 may be implemented in various embedded systems for automotive, electronic, mobile, server and Internet-of-things (IoT) applications.

As shown in FIG. 1, the bitcell architecture 104 includes memory bitcell structures 108, 110, such as, e.g., a first multi-transistor bitcell structure 108 for a write port and a second multi-transistor bitcell structure 110 for a read-port. In some implementations, the first bitcell structure 108 may be configured as the six-transistor (6T) bitcell structure with a write port, and the second bitcell structure 110 may be configured as the two-transistor (2T) read port. Thus, combination of bitcell structures 108, 110 may refer to the 8T dual-port bitcell architecture 104 for some memory applications, including, e.g., static random access memory (SRAM) applications.

In some implementations, the six-transistors (6T) of the 6T bitcell structure 108 may have multiple (e.g., 4) N-type metal-oxide-semiconductor (NMOS) transistors along with multiple (e.g., 2) P-type MOS (PMOS) transistors. In various scenarios, a passgate transistor (T1) is coupled between a first bitline (BL) and node (A), and another passgate transistor (T6) is coupled between a second bitline (BLB) and node (B). Also, the second bitline (BLB) is complementary to the first bitline (BL). The wordline (WL) may be coupled to gates of transistors (T1, T6) to access data stored in the latch formed with transistors (T2, T3, T4, T5) via the wordline (WL) and complementary bitlines (BL, BLB). Transistors (T2, T3) are coupled in series between the voltage supply (Vdd) and ground (Gnd or Vss), wherein node (A) is formed between pull-up transistor (T2) and pull-down transistor (T3). Also, transistors (T4, T5) are coupled in series between voltage supply (Vdd) and ground (Gnd or Vss), wherein node (B) is formed between pull-up transistor (T4) and pull-down transistor (T5). Transistors (T2, T3) are cross-coupled with transistors (T4, T5) such that node (A) is coupled to gates of transistors (T4, T5) and such that node (B) is coupled to gates of transistors (T2, T3). In various instances, transistors (T2, T4) may refer to P-type field-effect transistors (PFET), and further, transistors (T1, T3, T5, T6) may refer to N-type FET (NFET) transistors. However, various other configurations may be used to achieve similar results, characteristics and/or behavior.

In some implementations, the two-transistors (2T) of the 2T read port 110 may include multiple (e.g., 2)N-type MOS (NMOS) transistors. Also, in some scenarios, a first passgate transistor (T7) is coupled between the read bitline (RBL) and a second passgate transistor (T8), and also, the second passgate transistor (T8) is coupled between the first passgate transistor (T7) and ground (Gnd or Vss). The read wordline (RWL) is coupled to the gate of the first passgate transistor (T7), and also, node (C) is coupled to the gate of the second passgate transistor (T8), wherein node (C) refers to node (A).

In some implementations, the 8T dual-port bitcell architecture 104 as shown in FIG. 1 may be configured to provide for 1-read and 1-write (1R1 W). In some instances, various modern processors may use the bitcell architecture 104 for dual-port register file (RF2) memory in various applications. In some scenarios, the RF2 memory may use the 8T bitcell architecture 104 with the 6T bitcell structure 108 along with the dedicated single-ended 2T read port structure 110.

The bitcell architecture 104 may be implemented with one or more core arrays of bitcells or memory cells, wherein each bitcell may be configured to store at least one data-bit value (e.g., data value related to a logical '0' or '1'). The one or more core arrays may include any number of bitcells arranged in various configurations, such as, e.g., two-dimensional (2D) memory arrays having any number of columns and any number of rows of multiple bitcells, which may be arranged in a 2D grid pattern for read and write memory access. However, even though an SRAM bitcell structure is shown and described in FIG. 1, any other type of NVM bitcell structure may be used to achieve similar results of the various bitcell fabrication techniques disclosed herein. Thus, in various instances, each bitcell may be implemented with any type of volatile or NVM memory, including, e.g., magneto-resistive RAM (MRAM) and/or any other type of useable NVM memory. Also, each bitcell may have a multi-layer MRAM bitcell with a pinned layer (PL) and a free layer (FL), and for data access, each bitcell may include a wordline (WL), and in MRAM, the bitlines may refer to a bitline (BL) and a source line (SL).

FIGS. 2A-2H illustrate various diagrams of multi-transistor stack architecture in accordance with various implementations described herein. In particular, FIGS. 2A, 2C, 2E and 2G show various diagrams of the multi-transistor stack with a single common-gate architecture, and in addition, FIGS. 2B, 2D, 2F and 2H show various diagrams of the multi-transistor stack with a split-gate architecture.

Figure 2A:
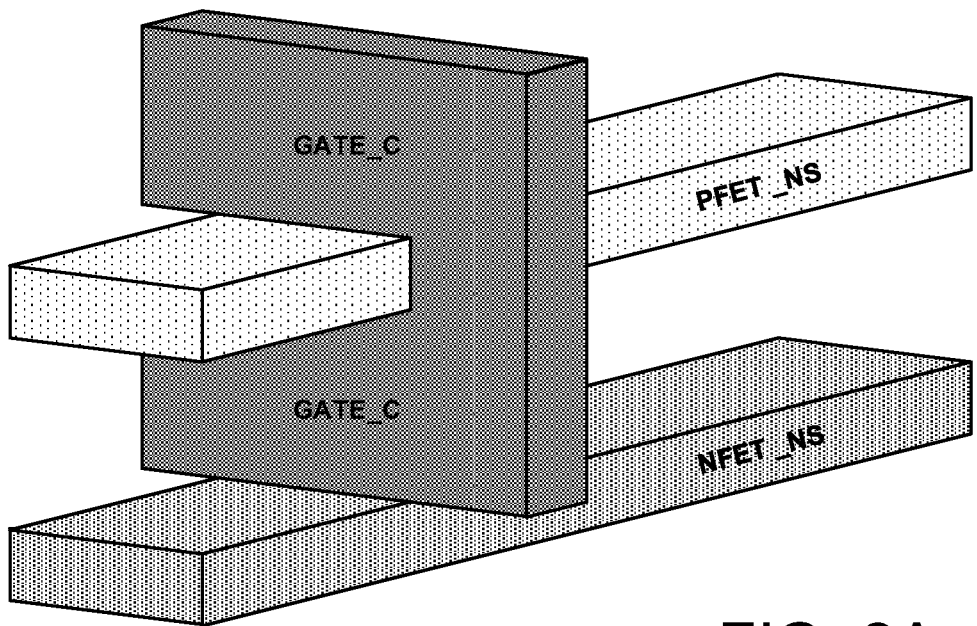
FIGS. 2A-2H illustrate various diagrams of multi-transistor stack architecture with 2T configurations in accordance with various implementations described herein.

As shown in FIG. 2A, the P-over-N common-gate multi-transistor architecture 204A may include multiple transistors (e.g., 1-PFET device over 1-NFET device) arranged in a multi-transistor stack configuration, such as, e.g., an NFET device formed in a first nano-sheet (NFET_NS) and a PFET device formed in a second nano-sheet (PFET_NS) that is disposed above the NFET_NS device. Also, in some instances, the common-gate architecture 204A may refer to a single gate (e.g., single poly gate) coupled to the multiple transistors, such as, e.g., the single common-gate (GATE_C) coupled to the PFET_NS device and the NFET_NS device. This arrangement may provide the P-over-N(PN) stack configuration as a two-FET stacked device that is manufactured and/or formed in a single monolithic semiconductor die or in a sequential manner. Also, in various instances, the complementary P-type and N-type transistors refer to P-type and N-type field-effect transistors (PFET and NFET) that are disposed as a pair of transistors arranged in the P-over-N stack configuration. Also, in some instances, the P-over-N multi-transistor architecture 204A with the common-gate (GATE_C) may be used to implement an inverter.

Figure 2B:
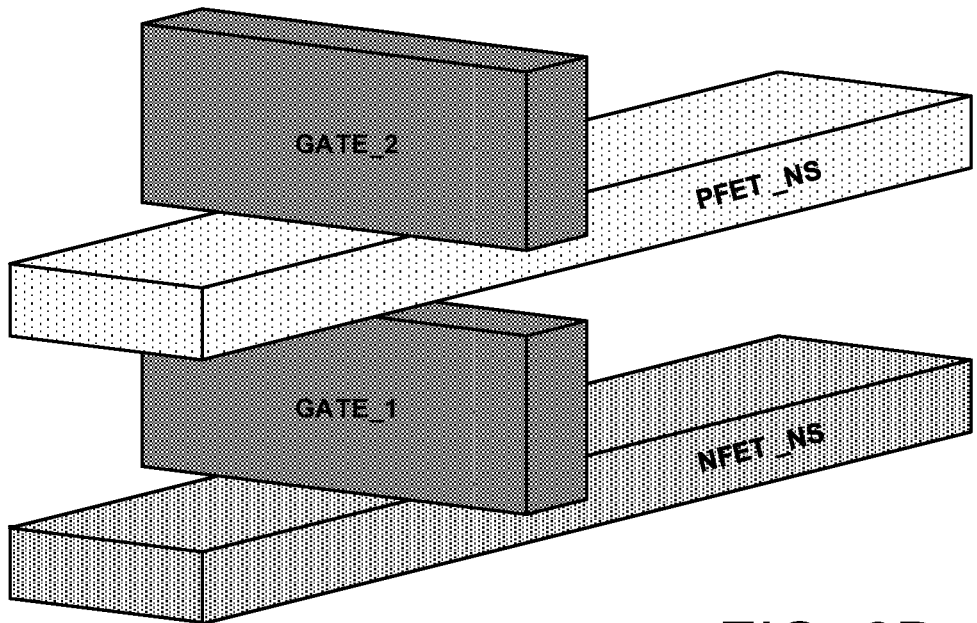

As shown in FIG. 2B, the P-over-N split-gate multi-transistor architecture 204B may include multiple transistors (e.g., 1-PFET device over 1-NFET device) arranged in a multi-transistor stack configuration, such as, e.g., an NFET device formed in a first nano-sheet (NFET_NS) and a PFET device formed in a second nano-sheet (PFET_NS) that is disposed above the NFET_NS device. Also, the split-gate architecture 204B may refer to multiple gates (e.g., dual poly gates) coupled to the multiple transistors, such as, e.g., a first gate (GATE_1) of the split-gate coupled to the NFET NS device and a second gate (GATE_2) of the split-gate coupled to the PFET_NS device. Also, this arrangement may provide the P-over-N(PN) stack configuration as a two-FET stacked device that is manufactured and/or formed in a single monolithic semiconductor die or in a sequential manner. Moreover, in some instances, the complementary P-type and N-type transistors refer to PFET/NFET devices that are disposed as a pair of transistors arranged in the P-over-N stack configuration.

Figure 2C:
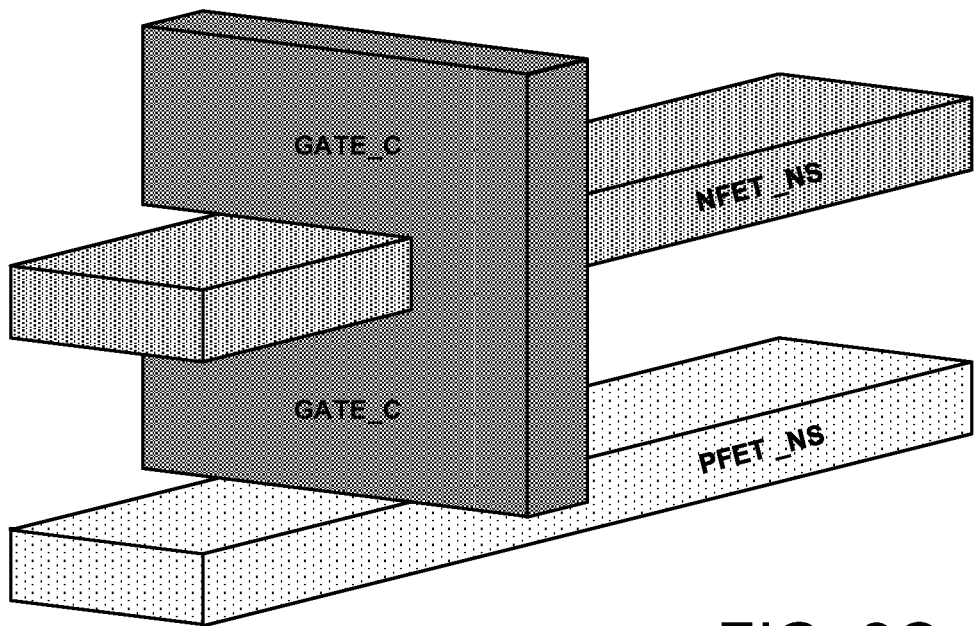

As shown in FIG. 2C, the N-over-P common-gate multi-transistor architecture 204C may include multiple transistors (e.g., 1-NFET device over 1-PFET device) arranged in a multi-transistor stack configuration, such as, e.g., a PFET device formed in a first nano-sheet (PFET_NS) and an NFET device formed in a second nano-sheet (NFET_NS) that is disposed above the PFET_NS device. Also, in some instances, the common-gate architecture 204C may refer to a single gate (e.g., single poly gate) coupled to the multiple transistors, such as, e.g., the single common-gate (GATE_C) coupled to the NFET_NS device and the PFET_NS device. This arrangement provides the N-over-P (NP) stack configuration as a two-FET stacked device that is manufactured and/or formed in a single monolithic semiconductor die or in a sequential manner. Further, in some instances, the complementary N-type and P-type transistors refer to NFET and PFET devices disposed as a pair of transistors that are arranged in the N-over-P stack configuration. Also, in some instances, the N-over-P multi-transistor architecture 204C with the common-gate (GATE_C) may be used to implement an inverter.

Figure 2D:
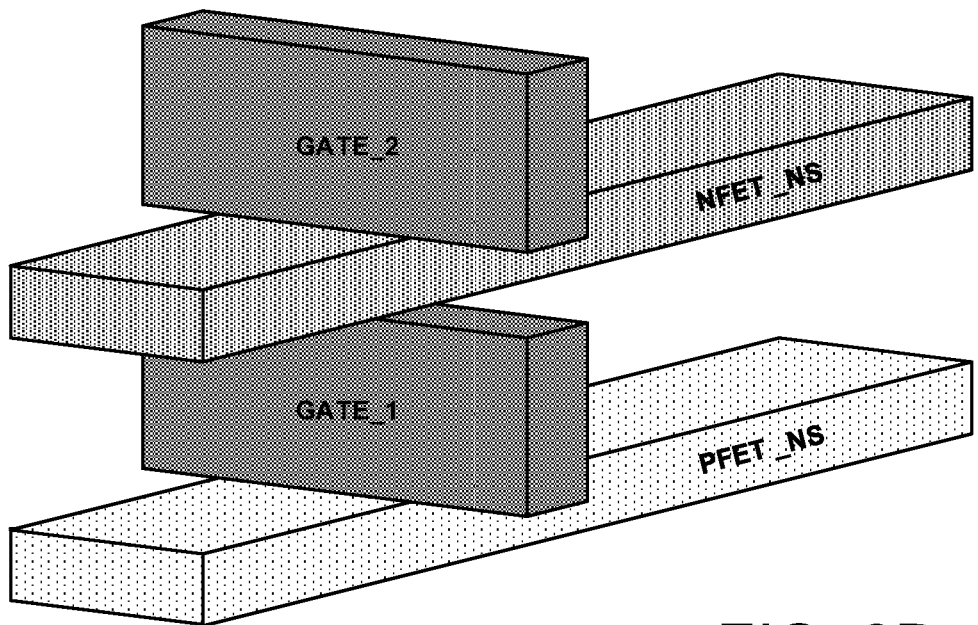

As shown in FIG. 2D, the N-over-P split-gate multi-transistor architecture 204D may include multiple transistors (e.g., 1-NFET device over 1-PFET device) arranged in a multi-transistor stack configuration, such as, e.g., a PFET device formed in a first nano-sheet (PFET_NS) and an NFET device formed in a second nano-sheet (NFET_NS) that is disposed above the PFET_NS device. Also, the split-gate architecture 204D may refer to multiple gates (e.g., dual poly gates) coupled to the multiple transistors, such as, e.g., a first gate (GATE_1) of the split-gate coupled to the PFET_NS device and a second gate (GATE_2) of the split-gate coupled to the NFET_NS device. Also, this arrangement may provide the N-over-P (NP) stack configuration as a two-FET stacked device that is manufactured and/or formed in a single monolithic semiconductor die or in a sequential manner. Moreover, in some instances, the complementary N-type and P-type transistors refer to NFET/PFET devices that are disposed as a pair of transistors arranged in the N-over-P stack configuration.

Figure 2E:
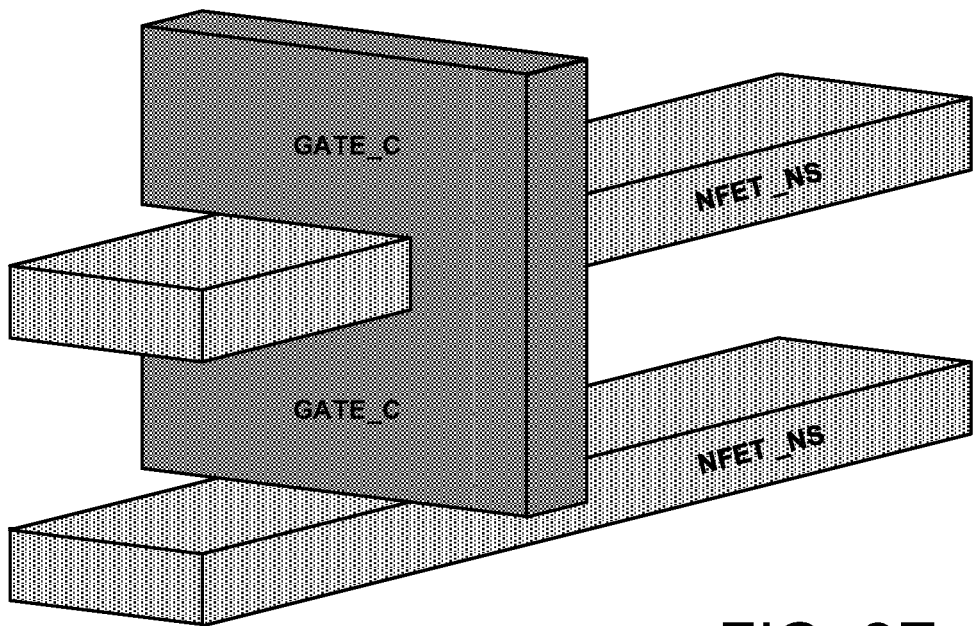

As shown in FIG. 2E, the N-over-N common-gate multi-transistor architecture 204E may include multiple transistors (e.g., 1-NFET device over 1-NFET device) arranged in a multi-transistor stack configuration, such as, e.g., a first NFET device formed in a first nano-sheet (NFET_NS_1) and a second NFET device formed in a second nano-sheet (NFET_NS_2) that is disposed above the NFET_NS_1 device. Also, in some instances, the common-gate architecture 204E refers to a single gate (e.g., single poly gate) coupled to the multiple transistors, such as, e.g., the single common-gate (GATE_C) coupled to the NFET_NS_1 device and the NFET_NS_2 device. This arrangement provides the N-over-N(NN) stack configuration as a two-FET stacked device that is manufactured and/or formed in a single monolithic semiconductor die or in a sequential manner. Moreover, in some instances, the dual N-over-N transistors refer to an NFET-over-NFET device disposed as a pair of transistors that are arranged in the N-over-N(NN) stack configuration.

In some implementations, the N-over-N multi-device stack 204E may refer to a device having a multi-transistor logic structure for use in memory architecture, wherein the multi-transistor logic structure has multiple transistors that are arranged in a single multi-transistor stack used to increase strength of the device. For instance, as shown in FIG. 2E, the N-over-N multi-device stack 204E includes two N-type transistors arranged in a single multi-transistor stack with a common-gate (GATE_C) that is used to increase strength of the device by a factor of two (e.g., double strength). In some instances, the common-gate (or single-gate) may be used to activate both transistors at the same time, which effectively doubles the strength of the N-over-N multi-device stack 204E.

Figure 2F:
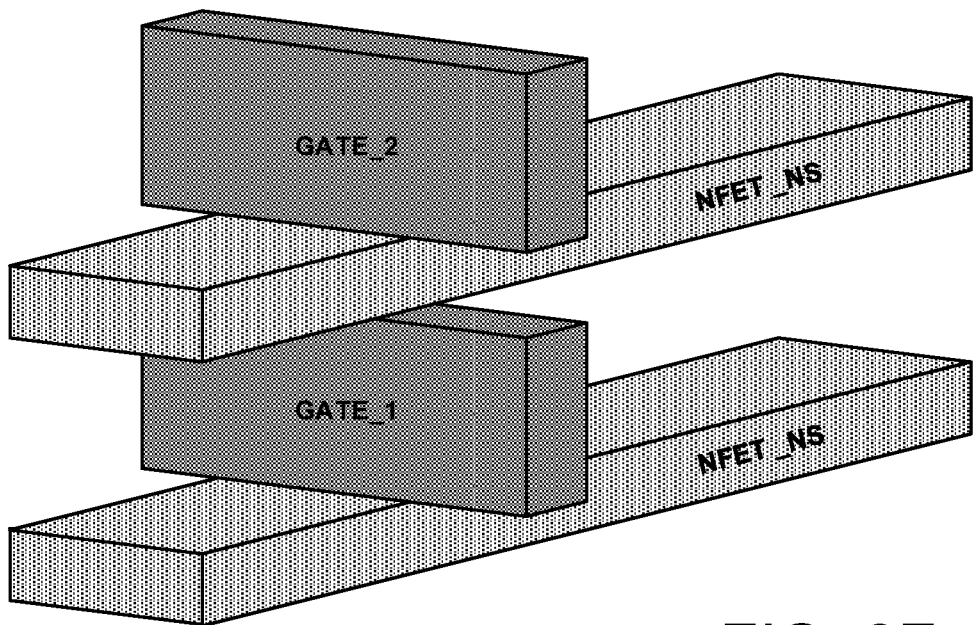

As shown in FIG. 2F, the N-over-N split-gate multi-transistor architecture 204F may include multiple transistors (e.g., 1-NFET device over 1-NFET device) arranged in a multi-transistor stack configuration, such as, e.g., a first NFET device formed in a first nano-sheet (NFET_NS_1) and a second NFET device formed in a second nano-sheet (NFET_NS_2) that is disposed above the NFET_NS_1 device. Also, in some instances, the split-gate architecture 204F may refer to multiple gates (e.g., dual poly gates) coupled to the multiple transistors, such as, e.g., a first gate (GATE_1) of the split-gate coupled to the NFET_NS_1 device and also a second gate (GATE_2) of the split-gate coupled to the NFET_NS_2 device. Also, as shown, this arrangement may provide the N-over-N(NN) stack configuration as a two-FET stacked device that is manufactured and/or formed in a single monolithic semiconductor die or in a sequential manner. Moreover, in some instances, the dual N-over-N transistors refer to an NFET-over-NFET device disposed as a pair of transistors that are arranged in the N-over-N(NN) stack configuration.

Figure 2G:
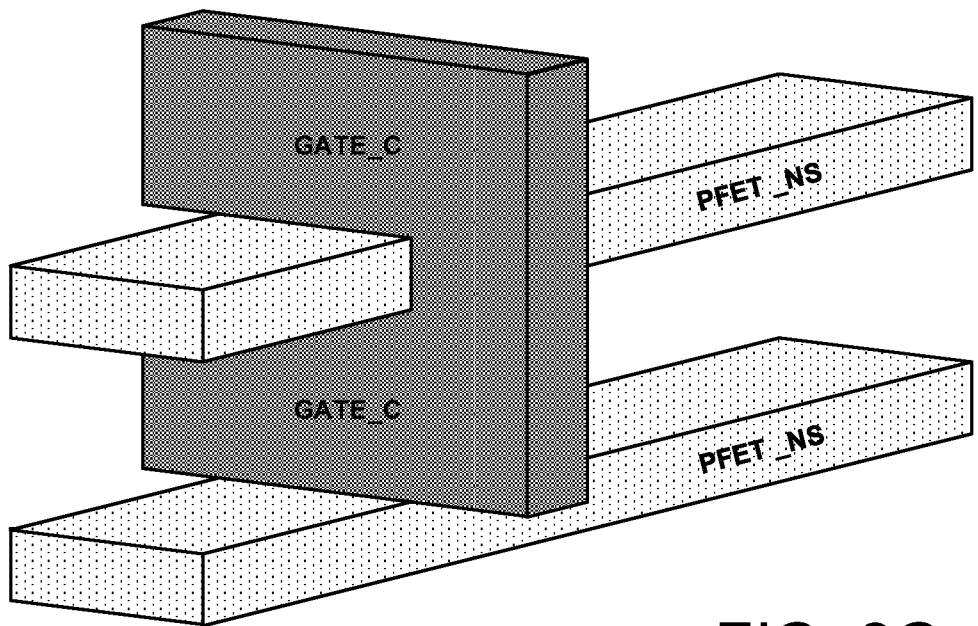

As shown in FIG. 2G, the P-over-P common-gate multi-transistor architecture 204E may include multiple transistors (e.g., 1-PFET device over 1-PFET device) arranged in a multi-transistor stack configuration, such as, e.g., a first PFET device formed in a first nano-sheet (PFET_NS_1) and a second PFET device formed in a second nano-sheet (PFET_NS_2) that is disposed above the PFET_NS_1 device. Also, in some instances, the common-gate architecture 204G refers to a single gate (e.g., single poly gate) coupled to the multiple transistors, such as, e.g., the single common-gate (GATE_C) coupled to the PFET_NS_1 device and the PFET_NS_2 device. This arrangement provides the P-over-P (PP) stack configuration as a two-FET stacked device that is manufactured and/or formed in a single monolithic semiconductor die or in a sequential manner. I Moreover, in some instances, the dual P-over-P transistors refer to a PFET-over-PFET device disposed as a pair of transistors that are arranged in the P-over-P (PP) stack configuration.

In some implementations, the P-over-P multi-device stack 204G may refer to a device having a multi-transistor logic structure for use in memory architecture, wherein the multi-transistor logic structure has multiple transistors that are arranged in a single multi-transistor stack used to increase strength of the device. For instance, as shown in FIG. 2G, the P-over-P multi-device stack 204G includes two P-type transistors arranged in a single multi-transistor stack with a common-gate (GATE_C) that is used to increase strength of the device by a factor of two (e.g., double strength). In some instances, the common-gate (or single-gate) may be used to activate both transistors at the same time, which effectively doubles the strength of the P-over-P multi-device stack 204G.

Figure 2H:
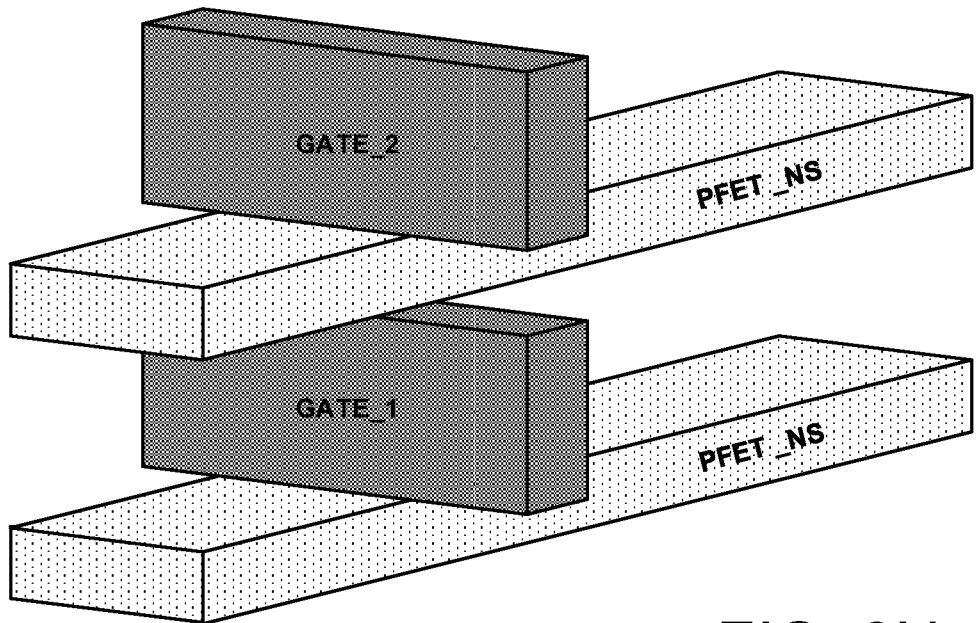

As shown in FIG. 2H, the P-over-P split-gate multi-transistor architecture 204H may include multiple transistors (e.g., 1-PFET device over 1-PFET device) arranged in a multi-transistor stack configuration, such as, e.g., a first PFET device formed in a first nano-sheet (PFET_NS_1) and a second PFET device formed in a second nano-sheet (PFET_NS_2) that is disposed above the PFET_NS_1 device. Also, in some instances, the split-gate architecture 204H may refer to multiple gates (e.g., dual poly gates) coupled to the multiple transistors, such as, e.g., a first gate (GATE_1) of the split-gate coupled to the PFET_NS_1 device and also a second gate (GATE_2) of the split-gate coupled to the PFET_NS_2 device. Also, as shown, this arrangement may provide the P-over-P (PP) stack configuration as a two-FET stacked device that is manufactured and/or formed in a single monolithic semiconductor die or in a sequential manner. Moreover, in some instances, the dual P-over-P transistors refer to a PFET-over-PFET device disposed as a pair of transistors that are arranged in the P-over-P (PP) stack configuration.

In some implementations, in reference to FIGS. 2A-2H, the gate architectures may utilize a common-gate architecture and/or a split-gate architecture. For instance, as shown in FIGS. 2A, 2C, 2E and 2G, the multiple transistors (PFET and NFET) may share a single gate structure. Thus, the pair of stacked PFET/NFET devices may share a single common-gate structure. In other instances, as shown in FIGS. 2B, 2D, 2F and 2H, the multiple transistors (PFET and NFET) may utilize a split-gate structure. Thus, the pair of stacked PFET/NFET devices may share a dual split-gate structure.

Figure 3A:
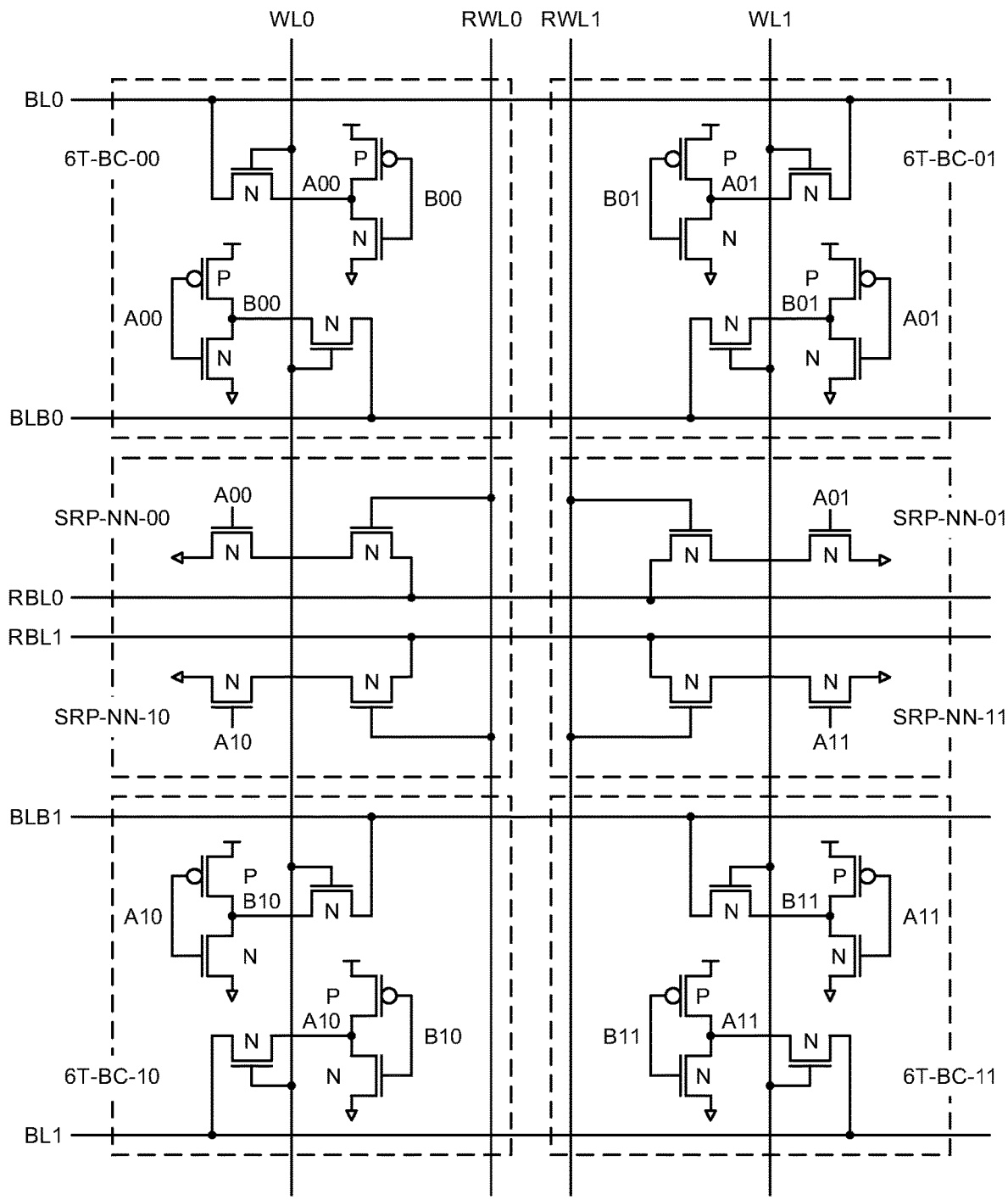
FIGS. 3A-3C illustrate various diagrams of bitcells with shared multi-transistor read port architecture in accordance with various implementations described herein.
Figure 3B:
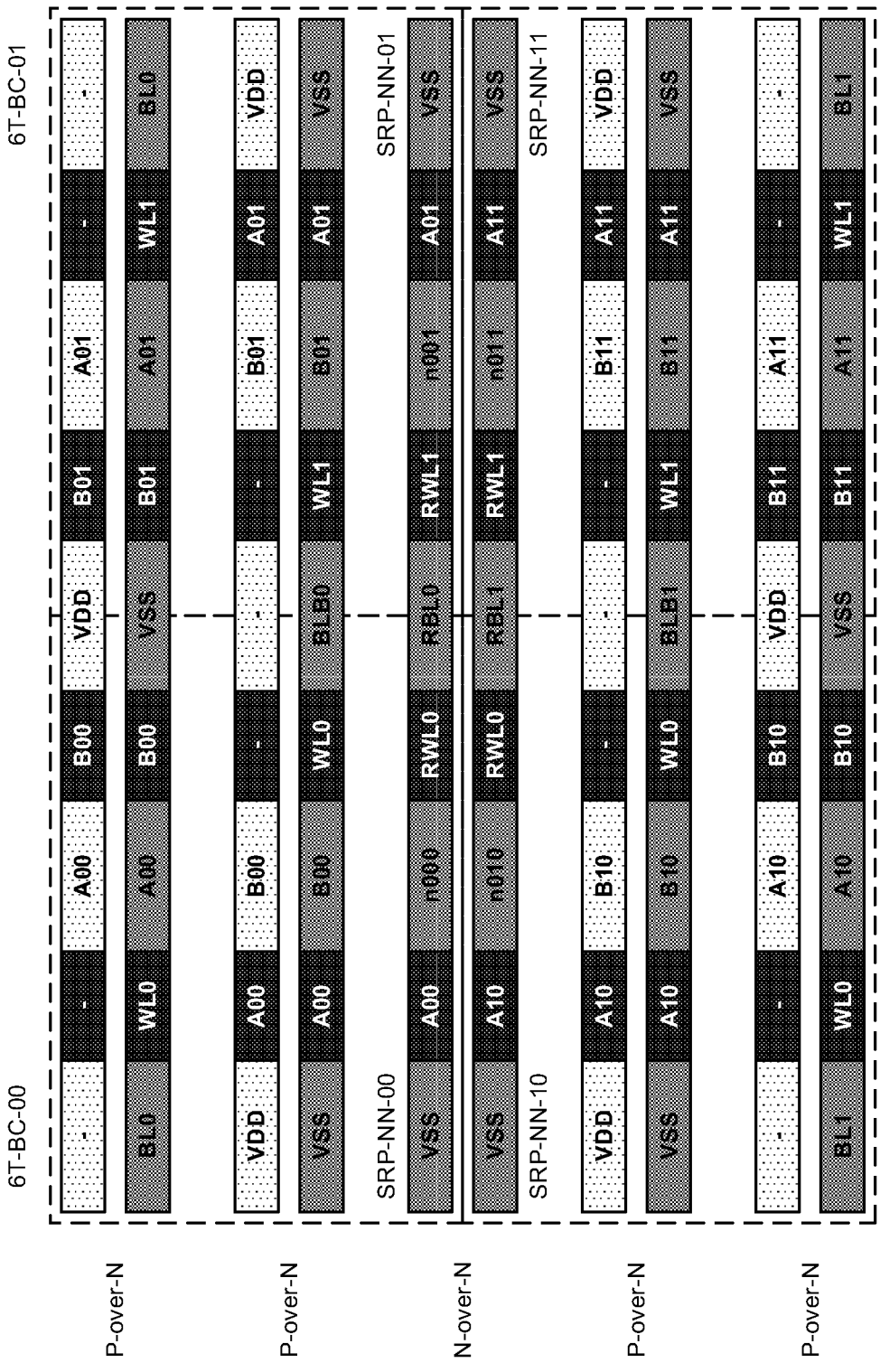
Figure 3C:
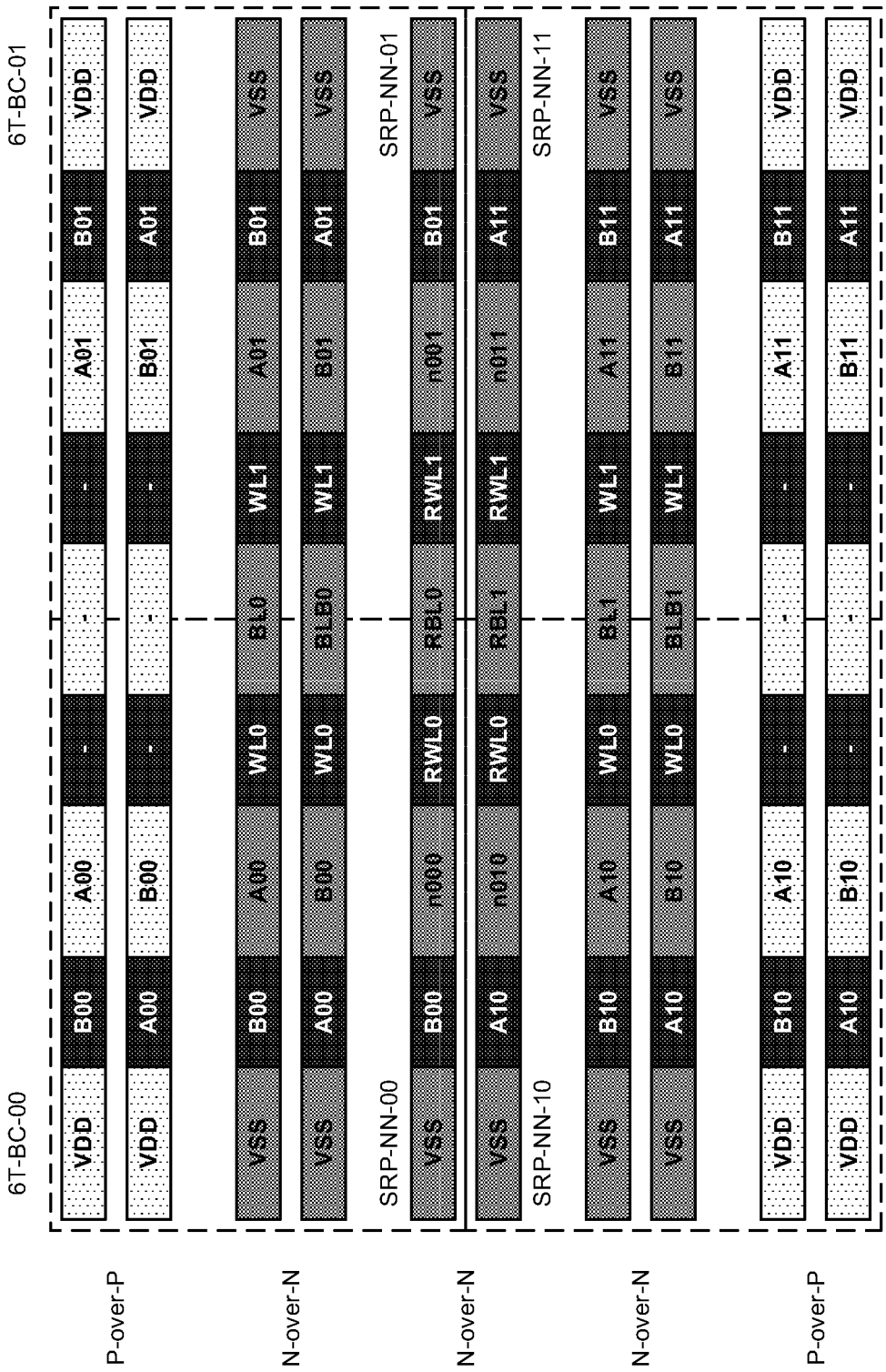

FIGS. 3A-3C illustrate various diagrams of bitcells with shared multi-transistor read port architecture in accordance with implementations described herein. In particular, FIG. 3A shows a schematic diagram 300A of 6T bitcells with shared N-over-N 2T read port architecture 304A, FIG. 3B shows another diagram 300B of 6T bitcells with shared N-over-N 2T read port architecture 304B, and FIG. 3C shows another diagram 300C of 6T bitcells with shared N-over-N 2T read port architecture 304C.

As shown in FIG. 3A, the bitcell architecture 304A may include a multi-bitcell structure, such as, e.g., 4 bitcells arranged with 2 bitcells (6T-BC-00, 6T-BC-10) disposed on a first side (or left-side) and with 2 bitcells (6T-BC-01, 6T-BC-11) disposed on a second side (or right-side). Also, in some instances, the 2 bitcells (6T-BC-00, 6T-BC-10) disposed on the first side are configured to share a first shared-read-port (SRP-NN-00, SRP-NN-10), and the 2 bitcells (6T-BC-01, 6T-BC-11) disposed on the second side are configured to share a second shared-read-port (SRP-NN-01, SRP-NN-11). Also, in some instances, the 6T bitcells (6T-BC-00, 6T-BC-10) may be coupled to share the N-over-N 2T read ports (SRP-NN-00, SRP-NN-10), and the 6T bitcells (6T-BC-01, 6T-BC-11) may be coupled to share the N-over-N 2T read ports (SRP-NN-01, SRP-NN-11).

In some implementations, the 6T bitcell (6T-BC-00) may include cross-coupled (PN) inverters coupled together via nodes (A00, B00) along with passgates (N) coupled to bitlines (BL0, BLB0) and wordline (WL0). The 6T bitcell (6T-BC-00) may be coupled to the shared read port (SRP-NN-00) via node (A00), wherein passgates (N) are coupled to the read bitline (RBL0), the read wordline (RWL0), node (A00), and ground (VSS).

In some implementations, the 6T bitcell (6T-BC-10) may include cross-coupled (PN) inverters coupled together via nodes (A10, B10) along with passgates (N) coupled to bitlines (BL1, BLB1) and wordline (WL0). The 6T bitcell (6T-BC-10) may be coupled to the shared read port (SRP-NN-10) via node (A10), wherein passgates (N) are coupled to the read bitline (RBL1), the read wordline (RWL0), node (A10), and ground (VSS).

In some implementations, the 6T bitcell (6T-BC-01) may include cross-coupled (PN) inverters coupled together via nodes (A01, B01) along with passgates (N) coupled to bitlines (BL0, BLB0) and wordline (WL1). The 6T bitcell (6T-BC-01) may be coupled to the shared read port (SRP-NN-01) via node (A01), wherein passgates (N) are coupled to the read bitline (RBL0), the read wordline (RWL1), node (A01), and ground (VSS).

In some implementations, the 6T bitcell (6T-BC-11) may include cross-coupled (PN) inverters coupled together via nodes (A11, B11) along with passgates (N) coupled to bitlines (BL1, BLB1) and wordline (WL1). The 6T bitcell (6T-BC-11) may be coupled to the shared read port (SRP-NN-11) via node (A11), wherein passgates (N) are coupled to the read bitline (RBL1), the read wordline (RWL1), node (A11), and ground (VSS).

FIG. 3B shows the bitcell architecture 304B with a physical layout pattern that is associated with the bitcell architecture 304A in FIG. 3A. The bitcell architecture 304B has multiple 6T bitcells with shared N-over-N 2T read port architecture.

As shown in FIG. 3B, the bitcell architecture 304B may include a multi-bitcell structure, such as, e.g., 4 bitcells arranged with 2 bitcells (6T-BC-00, 6T-BC-10) disposed on a first side (or left-side) and with 2 bitcells (6T-BC-01, 6T-BC-11) disposed on a second side (or right-side). Also, in some instances, the 2 bitcells (6T-BC-00, 6T-BC-10) disposed on the first side are configured to share a first shared-read-port (SRP-NN-00, SRP-NN-10), and the 2 bitcells (6T-BC-01, 6T-BC-11) disposed on the second side are configured to share a second shared-read-port (SRP-NN-01, SRP-NN-11). Also, in some instances, the 6T bitcells (6T-BC-00, 6T-BC-10) may be coupled to share the N-over-N 2T read ports (SRP-NN-00, SRP-NN-10), and the 6T bitcells (6T-BC-01, 6T-BC-11) may be coupled to share the N-over-N 2T read ports (SRP-NN-01, SRP-NN-11).

In some implementations, the 6T bitcell (6T-BC-00) may include cross-coupled inverters (P-over-N transistor stack) coupled together with nodes (A00, B00) and poly-Si gates along with passgates (N) coupled to bitlines (BL0, BLB0) and wordline (WL0). Also, the 6T bitcell (6T-BC-00) may be coupled to the shared read port (SRP-NN-00) via node (A00) with poly-Si gate, wherein passgates (N-over-N transistor stack) are coupled to read bitline (RBL0), read wordline (RWL0), node (A00), and ground (VSS).

In some implementations, the 6T bitcell (6T-BC-10) may include cross-coupled inverters (P-over-N transistor stack) coupled together with nodes (A10, B10) and poly-Si gates along with passgates (N) coupled to bitlines (BL1, BLB1) and wordline (WL0). Also, the 6T bitcell (6T-BC-10) may be coupled to the shared read port (SRP-NN-10) via node (A10) with poly-Si gate, wherein passgates (N-over-N transistor stack) are coupled to read bitline (RBL1), read wordline (RWL0), node (A10), and ground (VSS).

In some implementations, the 6T bitcell (6T-BC-01) may include cross-coupled inverters (P-over-N transistor stack) coupled together with nodes (A01, B01) and poly-Si gates along with passgates (N) coupled to bitlines (BL0, BLB0) and wordline (WL1). Also, the 6T bitcell (6T-BC-01) may be coupled to the shared read port (SRP-NN-01) via node (A01) with poly-Si gate, wherein passgates (N-over-N transistor stack) are coupled to read bitline (RBL0), read wordline (RWL1), node (A01), and ground (VSS).

In some implementations, the 6T bitcell (6T-BC-11) may include cross-coupled inverters (P-over-N transistor stack) coupled together with nodes (A11, B11) and poly-Si gates along with passgates (N) coupled to bitlines (BL1, BLB1) and wordline (WL1). Also, the 6T bitcell (6T-BC-11) may be coupled to the shared read port (SRP-NN-11) via node (A11) with poly-Si gate, wherein passgates (N-over-N transistor stack) are coupled to read bitline (RBL1), read wordline (RWL1), node (A11), and ground (VSS).

In some implementations, in reference to the physical layout structure shown in FIG. 3B, the architecture 304B may refer to an 8T bitcell structure with a 6T CFET bitcell and with a shared 2T read port utilizing an N-over-N transistor stack configuration that is shared across multiple columns, such as, e.g., 2 columns.

In reference to FIGS. 3A-3B, the bitcell architecture 304A, 304B may refer to a device having a multi-bitcell structure with shared read port. In some implementations, the bitcell architecture 304A, 304B has a multi-bitcell structure having multiple bitcells with first port transistors and second port transistors. The first port transistors may be arranged in a P-over-N(PN) stack configuration, and the second port transistors may be arranged in an N-over-N(NN) stack configuration. In some instances, the first port transistors may have at least one of write port transistors for a write port, first read port transistors for a first read port, or read-write port transistors for a read-write port. Also, in some instances, the second port transistors may refer to second read port transistors for a second read port that is used as a dedicated read port. Also, the multi-bitcell structure may employ the dedicated read port as a shared read port such that the multiple bitcells share a shared read port transistor stack, and the second port transistors may be configured to operate as the shared read port. The multiple bitcells have a first bitcell that uses the shared read port, and the multiple bitcells have a second bitcell that uses the shared read port.

In various implementations, the first port transistors may have P-type transistors and first N-type transistors that are arranged in the P-over-N stack configuration, and also, the second port transistors may have second N-type transistors that are arranged in the N-over-N stack configuration. Also, in various instances, the P-type transistors are P-type field-effect transistors (PFETs), the first N-type transistors are first N-type FETs (NFETs), and the second N-type transistors are second N-type FETs (NFETs). Moreover, in various instances, each bitcell of the multiple bitcells may have eight transistors (8T), the first port transistors may have six transistors (6T) for each bitcell, and the second port transistors may have two transistors (2T) for each bitcell. Also, the bitcells may refer to static random access memory (SRAM) bitcells configured for dual-port memory applications.

FIG. 3C shows the bitcell architecture 304C with a physical layout pattern that is associated with the bitcell architecture 304A in FIG. 3A. The bitcell architecture 304C has multiple 6T bitcells with shared N-over-N 2T read port architecture.

As shown in FIG. 3C, the bitcell architecture 304C may include a multi-bitcell structure, such as, e.g., 4 bitcells arranged with 2 bitcells (6T-BC-00, 6T-BC-10) disposed on a first side (or left-side) and with 2 bitcells (6T-BC-01, 6T-BC-11) disposed on a second side (or right-side). Also, in some instances, the 2 bitcells (6T-BC-00, 6T-BC-10) disposed on the first side are configured to share a first shared-read-port (SRP-NN-00, SRP-NN-10), and the 2 bitcells (6T-BC-01, 6T-BC-11) disposed on the second side are configured to share a second shared-read-port (SRP-NN-01, SRP-NN-11). Also, in some instances, the 6T bitcells (6T-BC-00, 6T-BC-10) may be coupled to share the N-over-N 2T read ports (SRP-NN-00, SRP-NN-10), and the 6T bitcells (6T-BC-01, 6T-BC-11) may be coupled to share the N-over-N 2T read ports (SRP-NN-01, SRP-NN-11).

In some implementations, the 6T bitcell (6T-BC-00) may include cross-coupled inverters (P-over-P/N-over-N transistor stacks) coupled together with nodes (A00, B00) and poly-Si gates along with passgates (N) coupled to bitlines (BL0, BLB0) and wordline (WL0). Also, the 6T bitcell (6T-BC-00) may be coupled to shared read port (SRP-NN-00) via node (A00) with poly-Si gate, and passgates (N-over-N transistor stack) are coupled to read bitline (RBL0), read wordline (RWL0), node (A00), and ground (VSS).

In some implementations, the 6T bitcell (6T-BC-10) may include cross-coupled inverters (P-over-P/N-over-N transistor stacks) coupled together with nodes (A10, B10) and poly-Si gates along with passgates (N) coupled to bitlines (BL1, BLB1) and wordline (WL0). Also, the 6T bitcell (6T-BC-10) may be coupled to shared read port (SRP-NN-10) via node (A10) with poly-Si gate, and passgates (N-over-N transistor stack) are coupled to read bitline (RBL1), read wordline (RWL0), node (A10), and ground (VSS).

In some implementations, the 6T bitcell (6T-BC-01) may include cross-coupled inverters (P-over-P/N-over-N transistor stacks) coupled together with nodes (A01, B01) and poly-Si gates along with passgates (N) coupled to bitlines (BL0, BLB0) and wordline (WL1). Also, the 6T bitcell (6T-BC-01) may be coupled to shared read port (SRP-NN-01) via node (A01) with poly-Si gate, and passgates (N-over-N transistor stack) are coupled to read bitline (RBL0), read wordline (RWL1), node (A01), and ground (VSS).

In some implementations, the 6T bitcell (6T-BC-11) may include cross-coupled inverters (P-over-P/N-over-N transistor stacks) coupled together with nodes (A11, B11) and poly-Si gates along with passgates (N) coupled to bitlines (BL1, BLB1) and wordline (WL1). Also, the 6T bitcell (6T-BC-11) may be coupled to shared read port (SRP-NN-11) via node (A11) with poly-Si gate, and passgates (N-over-N transistor stack) are coupled to read bitline (RBL1), read wordline (RWL1), node (A11), and ground (VSS).

In some implementations, in reference to the physical layout structure shown in FIG. 3C, the architecture 304C may refer to an 8T bitcell structure with 6T NS-over-NS bitcell along with a shared 2T read port utilizing an N-over-N transistor stack configuration that is shared across multiple columns, such as, e.g., 2 columns. In some instances, the 8T bitcell structure having N-over-N and P-over-P 6T bitcell stacked structures may be extendable to stacked NS (non-CFET) structures. As described herein, the NS-over-NS structure refers to nano-sheet (NS) over nano-sheet (NS) structure.

In reference to FIG. 3C, the bitcell architecture 304C may refer to a device having a multi-bitcell structure with shared read port. In some implementations, the bitcell architecture 304C may have a multi-bitcell structure having multiple bitcells with first port transistors and second port transistors. The first port transistors may be arranged in a P-over-P stack configuration and a first N-over-N stack configuration, and the second port transistors may be arranged in a second N-over-N stack configuration. In some instances, the first port transistors may have at least one of write port transistors for a write port, first read port transistors for a first read port, or read-write port transistors for a read-write port, and also, the second port transistors may have second read port transistors for a second read port that is used as a dedicated read port. The multi-bitcell structure may employ the dedicated read port as a shared read port such that the multiple bitcells share a shared read port transistor stack, and the second port transistors may be configured to operate as the shared read port. Further, in some instances, the multiple bitcells may have a first bitcell that uses the shared read port, and also, the multiple bitcells may have a second bitcell that uses the shared read port.

In various implementations, the first port transistors include P-type transistors that are arranged in the P-over-P stack configuration, the first port transistors include first N-type transistors that are arranged in the first N-over-N stack configuration, and also, the second port transistors include second N-type transistors that are arranged in the second N-over-N stack configuration. In various instances, the P-type transistors may be P-type, field-effect transistors (PFETs), the first N-type transistors may be first N-type FETs (NFETs), and the second N-type transistors may be second N-type FETs (NFETs). Also, in some instances, each bitcell of the multiple bitcells has eight transistors (8T), the first port transistors include six transistors (6T) for each bitcell, and the second port transistors include two transistors (2T) for each bitcell. Also, the bitcells may be static random access memory (SRAM) bitcells that are configured for dual-port memory applications.

Figure 4A:
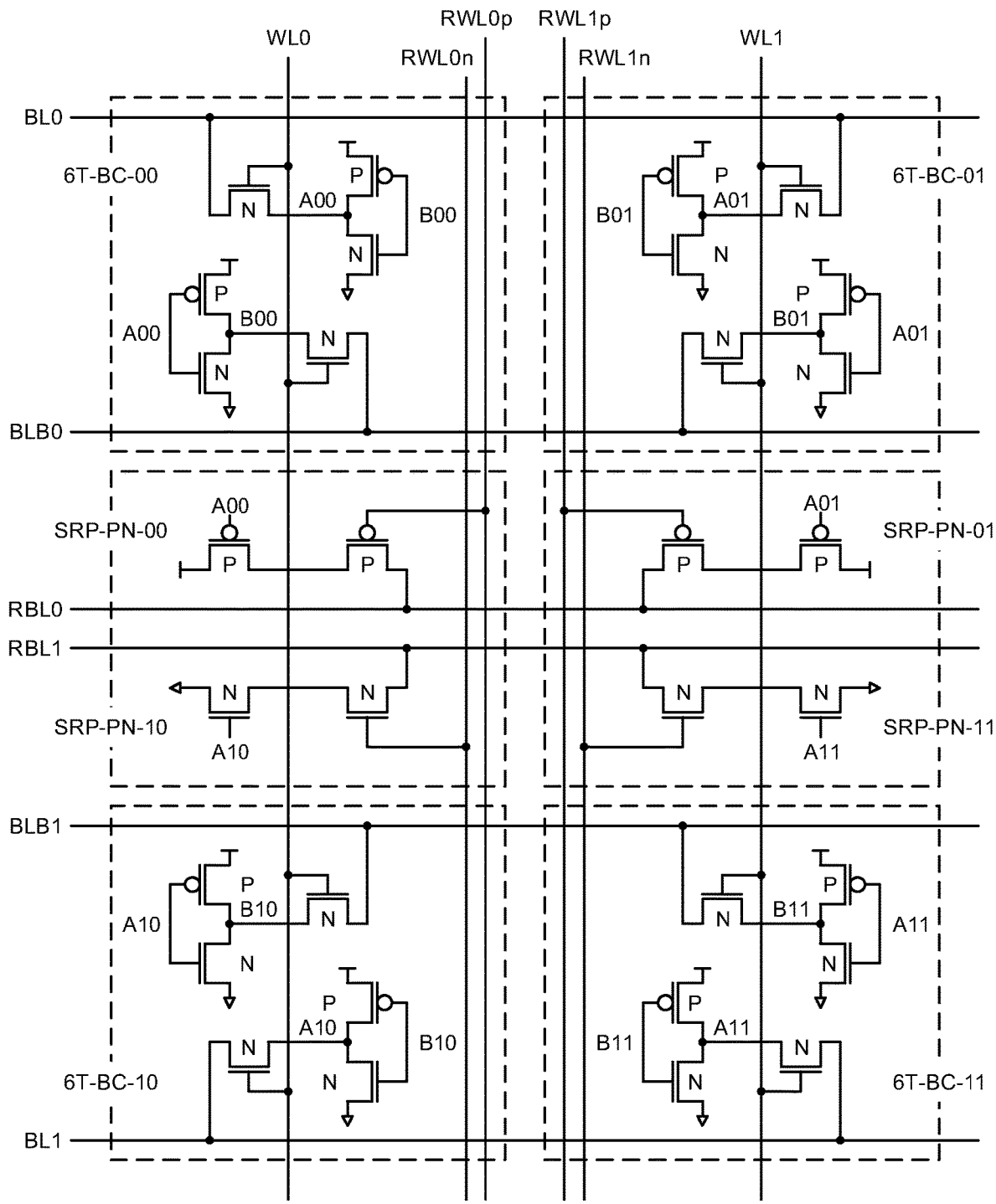
FIGS. 4A-4B illustrate various diagrams of bitcells with shared multi-transistor read port architecture in accordance with various implementations described herein.
Figure 4B:
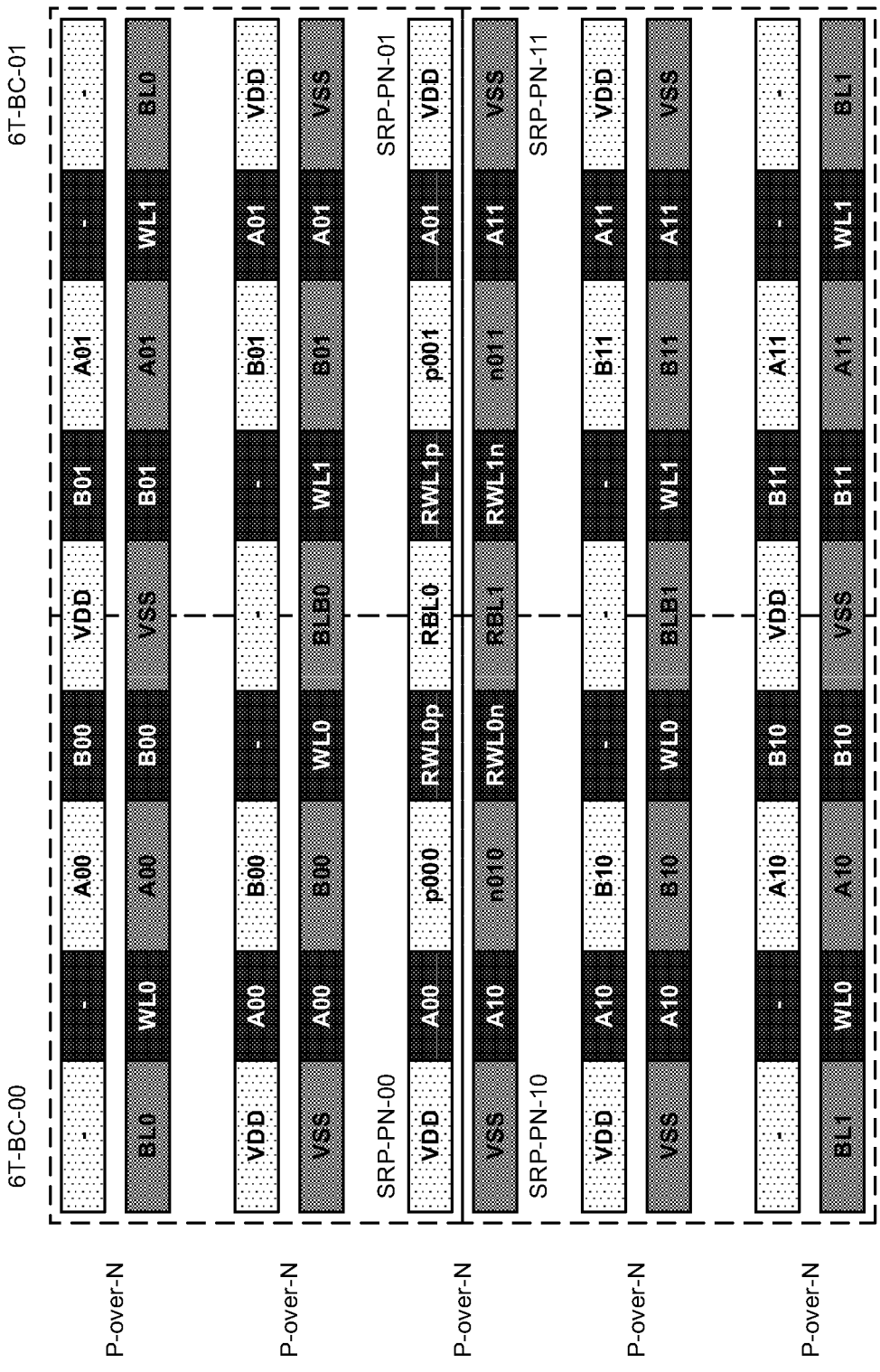

FIGS. 4A-4B illustrate various diagrams of bitcells with shared multi-transistor read port architecture in accordance with implementations described herein. In particular, FIG. 4A shows a schematic diagram 400A of 6T bitcells with shared P-over-N 2T read port architecture 404A, FIG. 4B shows another diagram 400B of 6T bitcells with shared P-over-N 2T read port architecture 404B.

As shown in FIG. 4A, the bitcell architecture 404A may include a multi-bitcell structure, such as, e.g., 4 bitcells arranged with 2 bitcells (6T-BC-00, 6T-BC-10) disposed on a first side (or left-side) and with 2 bitcells (6T-BC-01, 6T-BC-11) disposed on a second side (or right-side). Also, in some instances, the 2 bitcells (6T-BC-00, 6T-BC-10) disposed on first side are configured to share a first P-over-N shared-read-port (SRP-PN-00, SRP-PN-10), and the 2 bitcells (6T-BC-01, 6T-BC-11) disposed on second side are configured to share a second P-over-N shared-read-port (SRP-PN-01, SRP-PN-11). Also, in various instances, the 6T bitcells (6T-BC-00, 6T-BC-10) may be coupled to share P-over-N 2T read ports (SRP-PN-00, SRP-PN-10), and the 6T bitcells (6T-BC-01, 6T-BC-11) may be coupled to share P-over-N 2T read ports (SRP-PN-01, SRP-PN-11).

In some implementations, the 6T bitcell (6T-BC-00) may include cross-coupled (PN) inverters coupled together via nodes (A00, B00) along with passgates (PN) coupled to bitlines (BL0, BLB0) and wordline (WL0). The 6T bitcell (6T-BC-00) may be coupled to the shared read port (SRP-PN-00) via node (A00), wherein passgates (P) are coupled to the read bitline (RBL0), read wordline (RWL0p), node (A00), and supply (VDD).

In some implementations, the 6T bitcell (6T-BC-10) may include cross-coupled (PN) inverters coupled together via nodes (A10, B10) along with passgates (PN) coupled to bitlines (BL1, BLB1) and wordline (WL0). The 6T bitcell (6T-BC-10) may be coupled to the shared read port (SRP-PN-10) via node (A10), wherein passgates (N) are coupled to the read bitline (RBL1), read wordline (RWL0n), node (A10), and ground (VSS).

In some implementations, the 6T bitcell (6T-BC-01) may include cross-coupled (PN) inverters coupled together via nodes (A01, B01) along with passgates (PN) coupled to bitlines (BL0, BLB0) and wordline (WL1). The 6T bitcell (6T-BC-01) may be coupled to the shared read port (SRP-PN-01) via node (A01), wherein passgates (P) are coupled to the read bitline (RBL0), read wordline (RWL1p), node (A01), and supply (VDD).

In some implementations, the 6T bitcell (6T-BC-11) may include cross-coupled (PN) inverters coupled together via nodes (A11, B11) along with passgates (PN) coupled to bitlines (BL1, BLB1) and wordline (WL1). The 6T bitcell (6T-BC-11) may be coupled to the shared read port (SRP-PN-11) via node (A11), wherein passgates (N) are coupled to the read bitline (RBL1), read wordline (RWL1n), node (A11), and ground (VSS).

FIG. 4B shows the bitcell architecture 404B with a physical layout pattern that is associated with the bitcell architecture 404A in FIG. 4A. The bitcell architecture 404B has multiple 6T bitcells with shared P-over-N 2T read port architecture.

As shown in FIG. 4B, the bitcell architecture 404B may include a multi-bitcell structure, such as, e.g., 4 bitcells arranged with 2 bitcells (6T-BC-00, 6T-BC-10) disposed on a first side (or left-side) and with 2 bitcells (6T-BC-01, 6T-BC-11) disposed on a second side (or right-side). Also, in some instances, the 2 bitcells (6T-BC-00, 6T-BC-10) disposed on the first side are configured to share the first P-over-N shared-read-port (SRP-PN-00, SRP-PN-10), and the 2 bitcells (6T-BC-01, 6T-BC-11) disposed on the second side are configured to share the second shared-read-port (SRP-PN-01, SRP-PN-11). Also, the 6T bitcells (6T-BC-00, 6T-BC-10) may be coupled to share the P-over-N 2T read ports (SRP-PN-00, SRP-PN-10), and the 6T bitcells (6T-BC-01, 6T-BC-11) may be coupled to share the P-over-N 2T read ports (SRP-PN-01, SRP-PN-11).

In some implementations, the 6T bitcell (6T-BC-00) may include cross-coupled inverters (P-over-N transistor stack) coupled together with nodes (A00, B00) and poly-Si gates along with passgates (N) coupled to bitlines (BL0, BLB0) and wordline (WL0). Also, the 6T bitcell (6T-BC-00) may be coupled to the shared read port (SRP-PN-00) via node (A00) with poly-Si gate, wherein passgates (P-over-N transistor stack) are coupled to read bitline (RBL0), read wordline (RWL0p), node (A00), and supply (VDD).

In some implementations, the 6T bitcell (6T-BC-10) may include cross-coupled inverters (P-over-N transistor stack) coupled together with nodes (A10, B10) and poly-Si gates along with passgates (N) coupled to bitlines (BL1, BLB1) and wordline (WL0). Also, the 6T bitcell (6T-BC-10) may be coupled to the shared read port (SRP-PN-10) via node (A10) with poly-Si gate, wherein passgates (P-over-N transistor stack) are coupled to read bitline (RBL1), read wordline (RWL0n), node (A10), and ground (VSS).

In some implementations, the 6T bitcell (6T-BC-01) may include cross-coupled inverters (P-over-N transistor stack) coupled together with nodes (A01, B01) and poly-Si gates along with passgates (N) coupled to bitlines (BL0, BLB0) and wordline (WL1). Also, the 6T bitcell (6T-BC-01) may be coupled to the shared read port (SRP-PN-01) via node (A01) with poly-Si gate, wherein passgates (P-over-N transistor stack) are coupled to read bitline (RBL0), read wordline (RWL1p), node (A01), and supply (VDD).

In some implementations, the 6T bitcell (6T-BC-11) may include cross-coupled inverters (P-over-N transistor stack) coupled together with nodes (A11, B11) and poly-Si gates along with passgates (N) coupled to bitlines (BL1, BLB1)

and wordline (WL1). Also, the 6T bitcell (6T-BC-11) may be coupled to the shared read port (SRP-PN-11) via node (A11) with poly-Si gate, wherein passgates (P-over-N transistor stack) are coupled to read bitline (RBL1), read wordline (RWL1), node (A11), and ground (VSS).

In some implementations, in reference to the physical layout structure shown in FIG. 4B, the architecture 404B may refer to an 8T bitcell structure with mixed read port, including a 6T CFET bitcell and a shared 2T read port utilizing a P-over-N transistor stack configuration that is shared across multiple columns, such as, e.g., 2 columns. Therefore, in this instance, the mixed read port may utilize PMOS and NMOS devices.

In reference to FIGS. 4A-4B, the bitcell architecture 404A, 404B may refer to a device having a multi-bitcell structure with shared read port. In some implementations, the bitcell architecture 404A, 404B has a multi-bitcell structure having multiple bitcells with first port transistors and second port transistors. The first port transistors may be arranged in a first P-over-N stack configuration, and the second port transistors may be arranged in a second P-over-N stack configuration. In some instances, the first port transistors may have at least one of write port transistors for a write port, first read port transistors for a first read port, or read-write port transistors for a read-write port, and also, the second port transistors may have second read port transistors for a second read port that is used as a dedicated read port. Also, in some instances, the multi-bitcell structure may employ the dedicated read port as a shared read port such that the multiple bitcells share a shared read port transistor stack, and the second port transistors may be configured to operate as the shared read port. Further, in some instances, the multiple bitcells may have a first bitcell that uses the shared read port, and also, the multiple bitcells may have a second bitcell that uses the shared read port.

In various implementations, the first port transistors have first P-type transistors and first N-type transistors that are arranged in the first P-over-N stack configuration, and also, the second port transistors may have second P-type transistors and second N-type transistors that are arranged in the second P-over-N stack configuration. Also, in some instances, the first P-type transistors are first P-type field-effect transistors (PFETs), the first N-type transistors are first N-type FETs (NFETs), the second P-type transistors are second P-type FETs (PFETs), and the second N-type transistors are second N-type FETs (NFETs). Also, each bitcell of the multiple bitcells has eight transistors (8T), the first port transistors include six transistors (6T) for each bitcell, and the second port transistors include two transistors (2T) for each bitcell. Also, the bitcells may be static random access memory (SRAM) bitcells that are configured for dual-port memory applications.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device having a multi-bitcell structure with multiple bitcells. The multiple bitcells may include first port transistors and second port transistors. The first port transistors may be arranged in a P-over-N stack configuration, and also, the second port transistors may be arranged in an N-over-N stack configuration.

Described herein are various implementations of a device having a multi-bitcell structure with multiple bitcells. The multiple bitcells may include first port transistors and second port transistors. The first port transistors may be arranged in a P-over-P stack configuration and a first N-over-N stack configuration. The second port transistors may be arranged in a second N-over-N stack configuration.

Described herein are various implementations of a device having a multi-bitcell structure with multiple bitcells. The multiple bitcells may include first port transistors and second port transistors. The first port transistors may be arranged in a first P-over-N stack configuration, and also, the second port transistors may be arranged in a second P-over-N stack configuration.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower";

"upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, specific features and acts described above are disclosed as example forms of implementing the claims.

What is claimed is:

1. A device comprising:
a multi-bitcell structure having multiple bitcells with first port transistors and second port transistors,
wherein the first port transistors are arranged in a P-over-N stack configuration, and
wherein the second port transistors are arranged in an N-over-N stack configuration.

2. The device of claim 1, wherein:
the first port transistors comprise at least one of write port transistors for a write port, first read port transistors for a first read port, or read-write port transistors for a read-write port, and
the second port transistors comprise second read port transistors for a second read port that is used as a dedicated read port.

3. The device of claim 2, wherein:
the multi-bitcell structure employs the dedicated read port as a shared read port such that the multiple bitcells share a shared read port transistor stack, and
the second port transistors are configured to operate as the shared read port.

4. The device of claim 3, wherein:
the multiple bitcells have a first bitcell that uses the shared read port, and
the multiple bitcells have a second bitcell that uses the shared read port.

5. The device of claim 1, wherein:
the first and the second port transistors comprise a single gate architecture;
the first port transistors include P-type transistors and first N-type transistors that are arranged in the P-over-N stack configuration, and
the second port transistors include second N-type transistors that are arranged in the N-over-N stack configuration.

6. The device of claim 5, wherein:
the P-type transistors are P-type field-effect transistors (PFETs),
the first N-type transistors are first N-type FETs (NFETs), and
the second N-type transistors are second N-type FETs (NFETs).

7. The device of claim 1, wherein:
the first and the second port transistors comprise a split-gate architecture;
each bitcell of the multiple bitcells has eight transistors (8T),
the first port transistors include six transistors (6T) for each bitcell, and
the second port transistors include two transistors (2T) for each bitcell.

8. A device comprising:
a multi-bitcell structure having multiple bitcells with first port transistors and second port transistors,
wherein the first port transistors are arranged in a P-over-P stack configuration and a first N-over-N stack configuration, and
wherein the second port transistors are arranged in a second N-over-N stack configuration.

9. The device of claim 8, wherein:
the first port transistors comprise at least one of write port transistors for a write port, first read port transistors for a first read port, or read-write port transistors for a read-write port, and
the second port transistors comprise second read port transistors for a second read port that is used as a dedicated read port.

10. The device of claim 9, wherein:
the multi-bitcell structure employs the dedicated read port as a shared read port such that the multiple bitcells share a shared read port transistor stack, and
the second port transistors are configured to operate as the shared read port.

11. The device of claim 10, wherein:
the multiple bitcells have a first bitcell that uses the shared read port, and
the multiple bitcells have a second bitcell that uses the shared read port.

12. The device of claim 8, wherein:
the first and the second port transistors comprise a single gate architecture;
the first port transistors include P-type transistors that are arranged in the P-over-P stack configuration,
the first port transistors include first N-type transistors that are arranged in the first N-over-N stack configuration, and
the second port transistors include second N-type transistors that are arranged in the second N-over-N stack configuration.

13. The device of claim 12, wherein:
the P-type transistors are P-type field-effect transistors (PFETs),
the first N-type transistors are first N-type FETs (NFETs), and
the second N-type transistors are second N-type FETs (NFETs).

14. The device of claim 8, wherein:
the first and the second port transistors comprise a split-gate architecture;
each bitcell of the multiple bitcells has eight transistors (8T),
the first port transistors include six transistors (6T) for each bitcell, and
the second port transistors include two transistors (2T) for each bitcell.

15. A device comprising:
a multi-bitcell structure having multiple bitcells with first port transistors and second port transistors,
wherein the first port transistors are arranged in a first P-over-N stack configuration, and
wherein the second port transistors are arranged in a second P-over-N stack configuration.

16. The device of claim 15, wherein:
the first port transistors comprise at least one of write port transistors for a write port, first read port transistors for a first read port, or read-write port transistors for a read-write port, and
the second port transistors comprise second read port transistors for a second read port that is used as a dedicated read port.

17. The device of claim 16, wherein:
the multi-bitcell structure employs the dedicated read port as a shared read port such that the multiple bitcells share a shared read port transistor stack, and
the second port transistors are configured to operate as the shared read port.

18. The device of claim 17, wherein:
the multiple bitcells have a first bitcell that uses the shared read port, and
the multiple bitcells have a second bitcell that uses the shared read port.

19. The device of claim 15, wherein:
the first and the second port transistors comprise a single gate architecture;
the first port transistors include first P-type transistors and first N-type transistors that are arranged in the first P-over-N stack configuration, and
the second port transistors include second P-type transistors and second N-type transistors that are arranged in the second P-over-N stack configuration.

20. The device of claim 19, wherein:
the first and the second port transistors comprise a split-gate architecture;
the first P-type transistors are first P-type field-effect transistors (PFETs),
the first N-type transistors are first N-type FETs (NFETs),
the second P-type transistors are second P-type FETs (PFETs), and
the second N-type transistors are second N-type FETs (NFETs).

* * * * *